United States Patent
Sato et al.

(10) Patent No.: US 7,851,890 B2
(45) Date of Patent: Dec. 14, 2010

(54) SEMICONDUCTOR DEVICE AND METHOD FOR MANUFACTURING THE SAME

(75) Inventors: Hidekazu Sato, Kawasaki (JP); Toshihiro Wakabayashi, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/878,509

(22) Filed: Jul. 25, 2007

(65) Prior Publication Data

US 2008/0035955 A1 Feb. 14, 2008

Related U.S. Application Data

(62) Division of application No. 11/117,433, filed on Apr. 29, 2005, now Pat. No. 7,262,483, which is a division of application No. 10/665,210, filed on Sep. 22, 2003, now Pat. No. 6,903,439.

(30) Foreign Application Priority Data

Sep. 20, 2002 (JP) ............... 2002-275758

(51) Int. Cl.
*H01L 27/082* (2006.01)
*H01L 29/70* (2006.01)

(52) U.S. Cl. ............... 257/592; 257/197; 438/350

(58) Field of Classification Search .......... 257/197, 257/592, 586, E29.027, E29.028, E27.017, 257/E27.019; 438/318, 350
See application file for complete search history.

(56) References Cited

U.S. PATENT DOCUMENTS

| | | | |
|---|---|---|---|
| 5,321,301 A | * | 6/1994 | Sato et al. ............. 257/592 |
| 5,541,124 A | | 7/1996 | Miwa et al. |
| 5,643,806 A | | 7/1997 | Miwa et al. |
| 5,766,999 A | * | 6/1998 | Sato .................... 438/309 |

(Continued)

FOREIGN PATENT DOCUMENTS

JP  5-226353 A  9/1993

(Continued)

OTHER PUBLICATIONS

Patent Abstracts of Japan, Publication No. 5-062991, dated Mar. 12, 1993.

(Continued)

*Primary Examiner*—Theresa T Doan
(74) *Attorney, Agent, or Firm*—Westerman, Hattori, Daniels & Adrian, LLP

(57) ABSTRACT

By a non-selective epitaxial growth method, an SiGe film is grown on the whole surface of a silicon oxide film so as to cover an inner wall of a base opening. Here, such film forming conditions are selected that, inside the base opening, a bottom portion is formed of single crystal, other portions such as a sidewall portion are formed of polycrystalline, and a film thickness of the sidewall portion is less than or equal to 1.5 times the film thickness of the bottom portion. In this non-selective epitaxial growth, monosilane, hydrogen, diborane, and germane are used as source gases. Then, flow rates of monosilane and hydrogen are set to 20 sccm and 20 slm respectively. Also, a growth temperature is set to 650° C., a flow rate of diborane is set to 75 sccm, and a flow rate of germane is set to 35 sccm.

6 Claims, 15 Drawing Sheets

U.S. PATENT DOCUMENTS

| | | | |
|---|---|---|---|
| 5,856,228 A | 1/1999 | Miwa et al. | |
| 6,177,717 B1 | 1/2001 | Chantre et al. | |
| 6,436,781 B2 | 8/2002 | Sato | |
| 6,482,710 B2 | 11/2002 | Oda et al. | |
| 6,551,891 B1 | 4/2003 | Chantre et al. | |
| 2001/0009793 A1 | 7/2001 | Sato | |
| 2003/0006484 A1* | 1/2003 | Asai et al. | 257/565 |
| 2003/0201461 A1* | 10/2003 | Sato et al. | 257/197 |

FOREIGN PATENT DOCUMENTS

| | | |
|---|---|---|
| JP | 6-291132 A | 10/1994 |
| KR | 1999-82963 A | 11/1999 |

OTHER PUBLICATIONS

Patent Abstracts of Japan, Publication No. 10-125691, dated May 15, 1998.

Patent Abstracts of Japan, Publication No. 11-126781, dated May 11, 1999.

Korean Office Action dated Jun. 18, 2009, issued in corresponding Korean Patent Publication No. 1999-82963.

Japanese Office Action Jun. 16, 2009, issued in corresponding Japanese Patent Application No. 2002-275758.

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2002-275758, filed on Sep. 20, 2002, the entire contents of which are incorporated herein by reference.

BACKGROUND OF THE INVENTION

1. Field of the Invention

The present invention relates to a semiconductor device having a bipolar transistor and a method for manufacturing the same.

2. Description of the Related Art

Conventionally, there has been developed a bipolar transistor with such a construction that a base lead-out layer is electrically and directly connected to a substrate portion that is to be a collector.

In recent years, responding to demands for further miniaturization and performance enhancement of bipolar transistors, a method has been devised to form a bipolar transistor by a non-selective epitaxial growth method, using SiGe and/or SiGeC as the material for a base.

Also, as a manufacturing method of SiGe-HBT (Heterojunction Bipolar Transistor), such a method is generally adopted that an SiGe epitaxial film is grown on an Si substrate by a non-selective epitaxial method, and then polycrystalline SiGe is grown on an insulation film.

Prior arts are disclosed in Japanese Patent Laid-open No. 5-62991, Japanese Patent Laid-open No. 10-125691 and Japanese Patent Laid-open No. 11-126781.

However, when a non-selective epitaxial growth method is used to form a base of a bipolar transistor, its connection with an emitter becomes unstable, which can cause such a serious problem that the bipolar transistor does not function as a transistor. In such case, reliability of the transistor decreases.

Further, in an SiGe-HBT, SiGe on an insulating film is used as a lead-out wire to a base electrode, but its resistance cannot be lowered by an ordinary growth condition due to its insufficient film thickness. Accordingly, on a portion where the base electrode is to be formed, the resistance should be lowered by additionally forming Si film or the like on SiGe, which results in an increase of the manufacturing steps.

SUMMARY OF THE INVENTION

The present invention is made in consideration of the above-mentioned problems, and its first object is to provide a semiconductor device that can achieve high reliability by securely connecting an emitter and a base even when a semiconductor layer is formed by a non-selective epitaxial method, and a method for manufacturing the same. A second object of the present invention is to provide a semiconductor device which can be manufactured to have low base resistance with fewer manufacturing steps, and a method for manufacturing the same.

As a result of dedicated studies, the inventors of the present invention have found out that, in the prior manufacturing method, the unstable connection between a base and an emitter is caused by that the film thickness of a polycrystalline film of a base lead-out layer is too thick due to a difficulty of independently controlling the film thickness of a polycrystalline film of a base lead-out layer and the film thickness of a single crystal layer of a base layer. Specifically, in the prior method, as shown in FIG. 1, after a collector 102 is formed on the surface of a semiconductor substrate 101, an insulation film 103 and a polycrystalline silicon film 106 are formed, a base opening is formed therethrough, and a base layer 109 that also functions as the base lead-out layer is formed therein. Here, the thickness of a sidewall portion (the thickness in the vertical direction of a wall face) of the base layer 109 becomes too thick, so that when a sidewall 113 is formed thereafter, a sufficient opening cannot be formed on an insulation film 113a, which is the material of the sidewall. Thus, the base layer 109 is not connected to an emitter 114.

After finding out the causes of such problems of the prior art, the inventors of the present invention conducted further dedicated studies and, as a result, reached a conclusion that when SiGe or the like is used for the base layer to be epitaxially grown, growth speeds of a bottom portion and a side portion of the semiconductor layer to be grown inside the base opening can be controlled independently by adjusting a film forming temperature and an amount of source gas.

Based on these views, the inventors of the present invention have reached various aspects of the present invention as described below.

A first manufacturing method of a semiconductor device according to the present invention is directed to a manufacturing method of a semiconductor device having a bipolar transistor. In this manufacturing method, first, a collector is formed on the surface of a semiconductor substrate, an insulation film is formed on the semiconductor substrate, and thereafter a conductive film is formed on the insulation film. It should be noted that either of the formation of a collector or the formation of an insulation film can be carried out first. Next, an opening that exposes at least a part of the collector is formed in the insulation film and the conductive film, and a semiconductor film connected to the collector and to the conductive film is formed by a non-selective epitaxial method inside the opening. Then, an emitter is formed on the semiconductor film. When the semiconductor film is formed, a portion of the semiconductor film in contact with the collector is formed of single crystal, a portion of the semiconductor film in contact with the conductive film is formed of polycrystal, and the portion in contact with the conductive film is one to two times as thick as the portion in contact with the collector.

A second manufacturing method of a semiconductor device according to the present invention is directed to a manufacturing method of a semiconductor device having a bipolar transistor. In this manufacturing method, first, a collector is formed on the surface of a semiconductor substrate, and then an insulation film having an opening on a portion corresponding to the collector is formed on the semiconductor substrate. Next, inside the opening and on the insulation film, a semiconductor film is formed by non-selective epitaxial growth. A portion in contact with the collector of the semiconductor film functions as a base of single crystal, and a portion on the insulation film of the semiconductor film is composed of a single layer which is thicker than the portion in contact with the collector. Then an emitter is formed on the portion of the semiconductor film in contact with the collector.

DETAILED DESCRIPTION OF THE PREFERRED EMBODIMENTS

Figure 1:
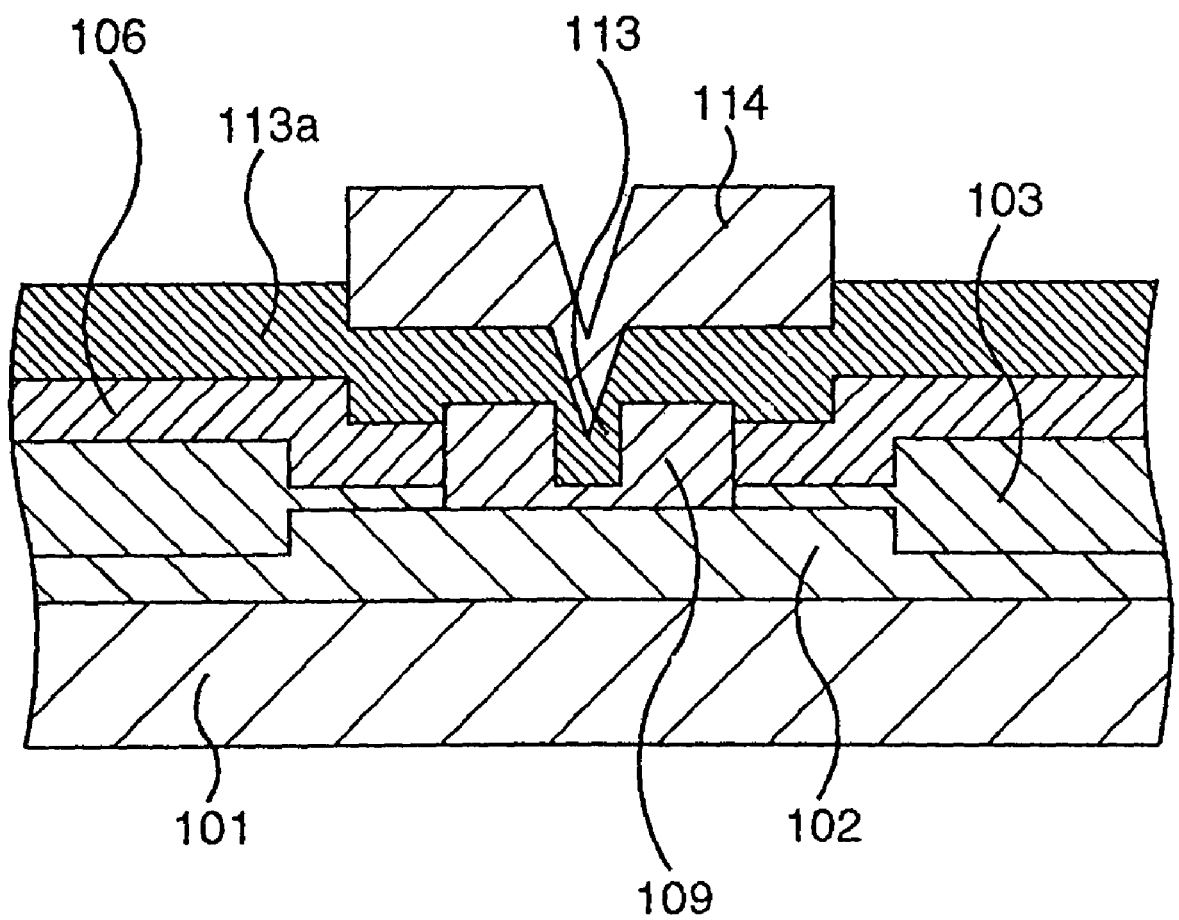
FIG. 1 is a cross-sectional view showing a semiconductor device having a conventional bipolar transistor.

Hereinafter, semiconductor devices and methods for manufacturing the same according to embodiments of the present invention will be specifically explained with reference to the attached drawings.

Fundamental Principles of the Present Invention

First, fundamental principles of the present invention will be explained. A non-selective epitaxial growth method is such a method that, on a single crystal semiconductor substrate such as an Si substrate, a region exposing its surface and a region where an insulation film or the like is used so as not to expose its surface are prepared in advance, in which a single crystal film is grown according to crystal information of the semiconductor substrate on the region exposing the surface of the semiconductor substrate, while a polycrystalline or amorphous film is grown on the region not exposing the surface of the semiconductor substrate.

On the other hand, a selective epitaxial growth method is such a method that a single crystal film is grown only on the region exposing a surface of a single crystal semiconductor substrate such as an Si substrate, and a film is not grown on the region not exposing a surface of the semiconductor substrate.

At this point, regarding conditions of the non-selective epitaxial growth to which the present invention is directed, a difference between the condition of growing a polycrystalline film on a region not exposing a semiconductor substrate such as an Si substrate and the condition of growing an amorphous film thereon will be explained. For convenience, a method for growing an Si film on a single crystal Si substrate by the non-selective epitaxial growth method will be explained as an example.

When growing a polycrystalline film on an insulation film (amorphous) whose crystal information is not available, crystal nuclei, which will be the nucleus of crystal information, are formed first on the insulation film. Thereafter, a large number of crystal grains are formed based on these crystal nuclei, and then a polycrystalline film grows. Although the mechanism of the crystal nucleus formation is unknown, in order for the crystal nuclei to grow, deposition species are needed to migrate adequately on an insulation film after they are flown over the insulation film.

On the other hand, when growing an amorphous film on an insulation film (amorphous) whose crystal information is not available, the formation of crystal nuclei is not required since an amorphous film grows disorderly. Accordingly, the deposition species continue to grow on the insulation film without migration and desorption.

Generally, in a thermal CVD (Chemical Vapor Deposition) method, a rate-controlling step of crystal growth is categorized into two types, a reaction rate-controlling and a supply rate-controlling.

When growing a polycrystalline film under the reaction rate-controlling, the growth temperature should be increased, and when growing an amorphous film, the growth temperature should be decreased.

On the other hand, under the supply rate-controlling condition, which of a polycrystalline film or an amorphous film to be grown can be selected by controlling an amount of material. Specifically, when growing a polycrystalline film, an amount of Si as the material should be decreased, and when growing an amorphous film, the amount of Si should be increased. For example, when growing a polycrystalline film, $SiH_4$ is used as the material, and when growing an amorphous film, $Si_2H_6$ is used.

However, the non-selective epitaxial growth has a condition that a single crystal film will be grown on an Si substrate, so that the range of its growth condition is limited as compared to forming a polycrystalline film or an amorphous film on an insulation film independently.

In the above explanation, the non-selective epitaxial growth of Si is presented as an example, but in case of an SiGe based mixed crystal, a polycrystalline film and an amorphous film can also be selectively grown by a similar method. However, in case of SiGe, it is commonly known that a crystallization temperature decreases by adding Ge to Si, and conditions of a polycrystallization temperature and a gas pressure are strictly different from those of the non-selective epitaxial growth of Si.

In addition, generally, in a batch type growth device, growth is mostly carried out under the condition of reaction rate-controlling from the perspective of uniformity of a film thickness on a position in a furnace. On the other hand, in a sheet-fed type growth device, growth is mostly performed under the condition of supply rate-controlling from the perspective of throughput.

Here, by the non-selective epitaxial growth method under the condition of reaction rate-controlling, it is difficult in principle to form an epitaxial film (single crystal film) and an amorphous film at the same time. On the other hand, under the condition of supply rate-controlling, it is possible to form an epitaxial film (single crystal film) and an amorphous film at the same time by selecting growth conditions. Therefore, the present invention is effective for growing an epitaxial film (single crystal film) and a polycrystalline film or an amorphous film at the same time by the non-selective epitaxial growth method under the condition of supply rate-controlling.

Figure 2A:
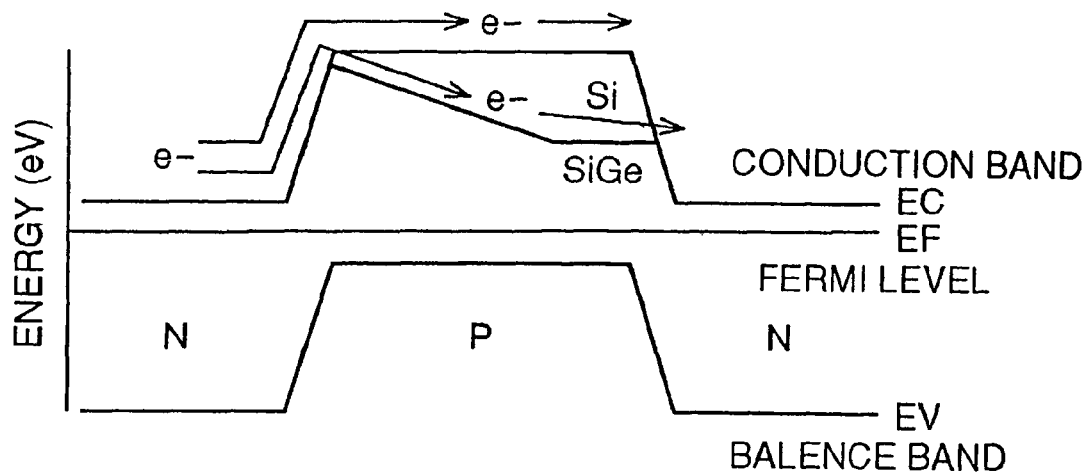
FIG. 2A and FIG. 2B are graphs respectively showing a relationship between a position inside a bipolar transistor and energy, and a relationship between a position inside the bipolar transistor and a Ge concentration.
Figure 2B:
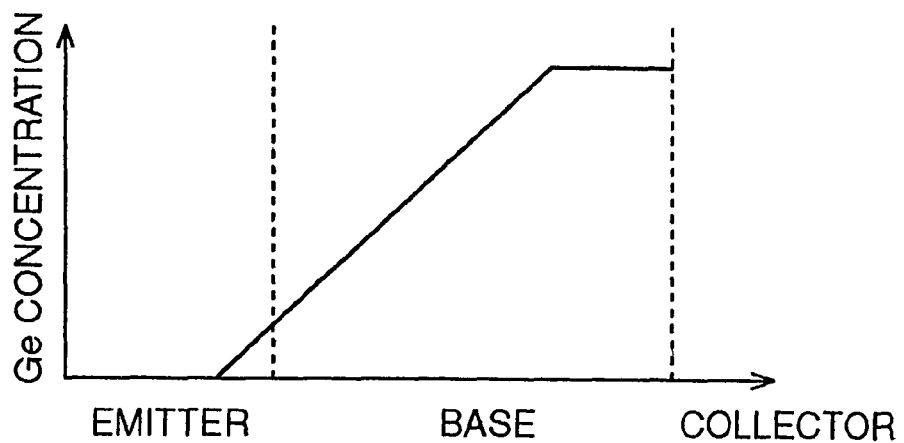

The base layer of an SiGe-HBT is formed of SiGe mixed crystal. Then, it is common that the base layer is designed to impart an inclination to a Ge concentration as shown in FIG. 2A and FIG. 2B for a purpose of accelerating a running speed of electrons in the base layer by continuously changing a band gap.

When imparting the inclination to the Ge concentration of the base layer, control of $SiH_4$ gas and $GeH_4$ gas is generally performed by controlling a flow rate ratio of a Ge source gas to an Si source gas from the gas supply part of a CVD thin film device.

While such formations of base layers are commonly performed, the inventors of the present invention have found out that, as a result of dedicated studies as described above, when forming an SiGe epitaxial film (single crystal film) to be a base layer and forming a polycrystalline film or an amorphous film on an insulation film at the same time by the non-selective epitaxial growth method, a growth speed and a film type (polycrystalline or amorphous) of a film to be formed on the insulation film can be controlled independently from a growth speed and a film type of the epitaxial film by controlling conditions such as Ge profile, growth temperature, source gas flow rate or the like of the SiGe epitaxial film to be a base layer.

Figure 3:
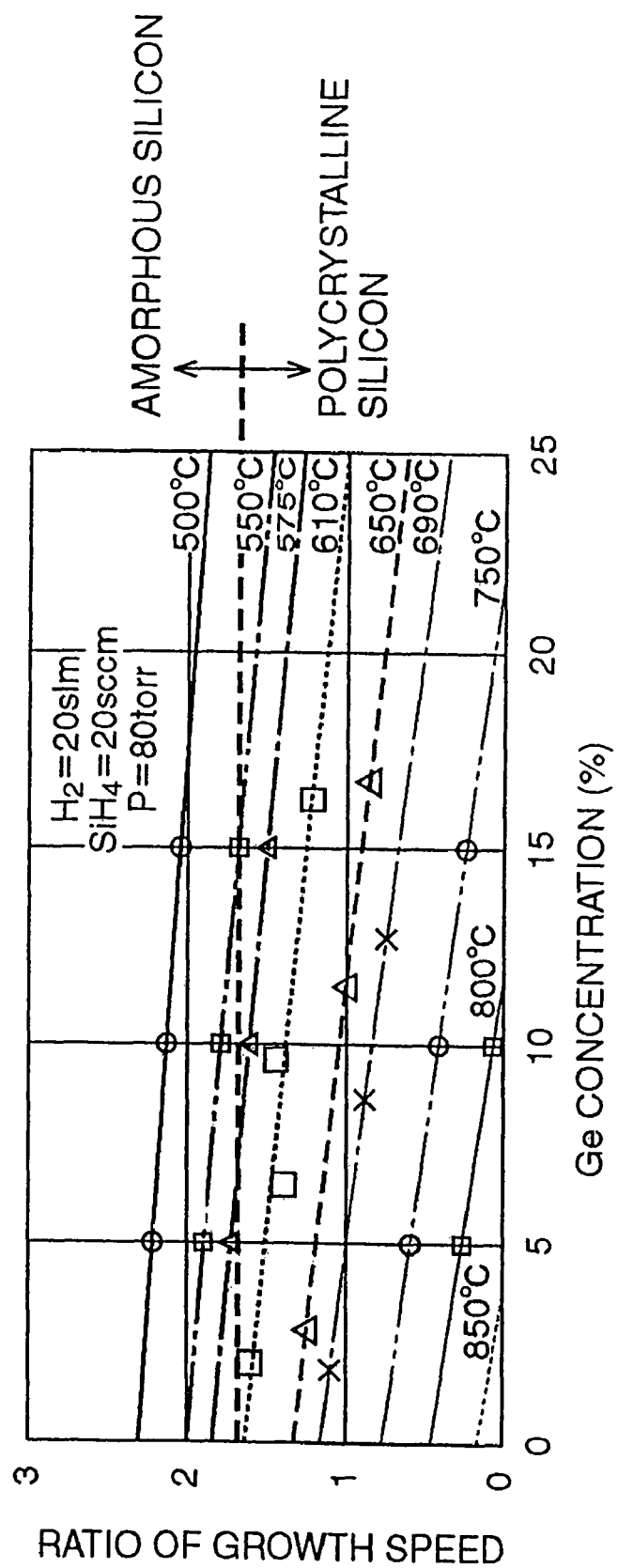
FIG. 3 is a graph showing a relationship between a Ge concentration of an epitaxial film and a ratio of a growth speed thereof when a growth temperature of the epitaxial film is changed.
Figure 4:
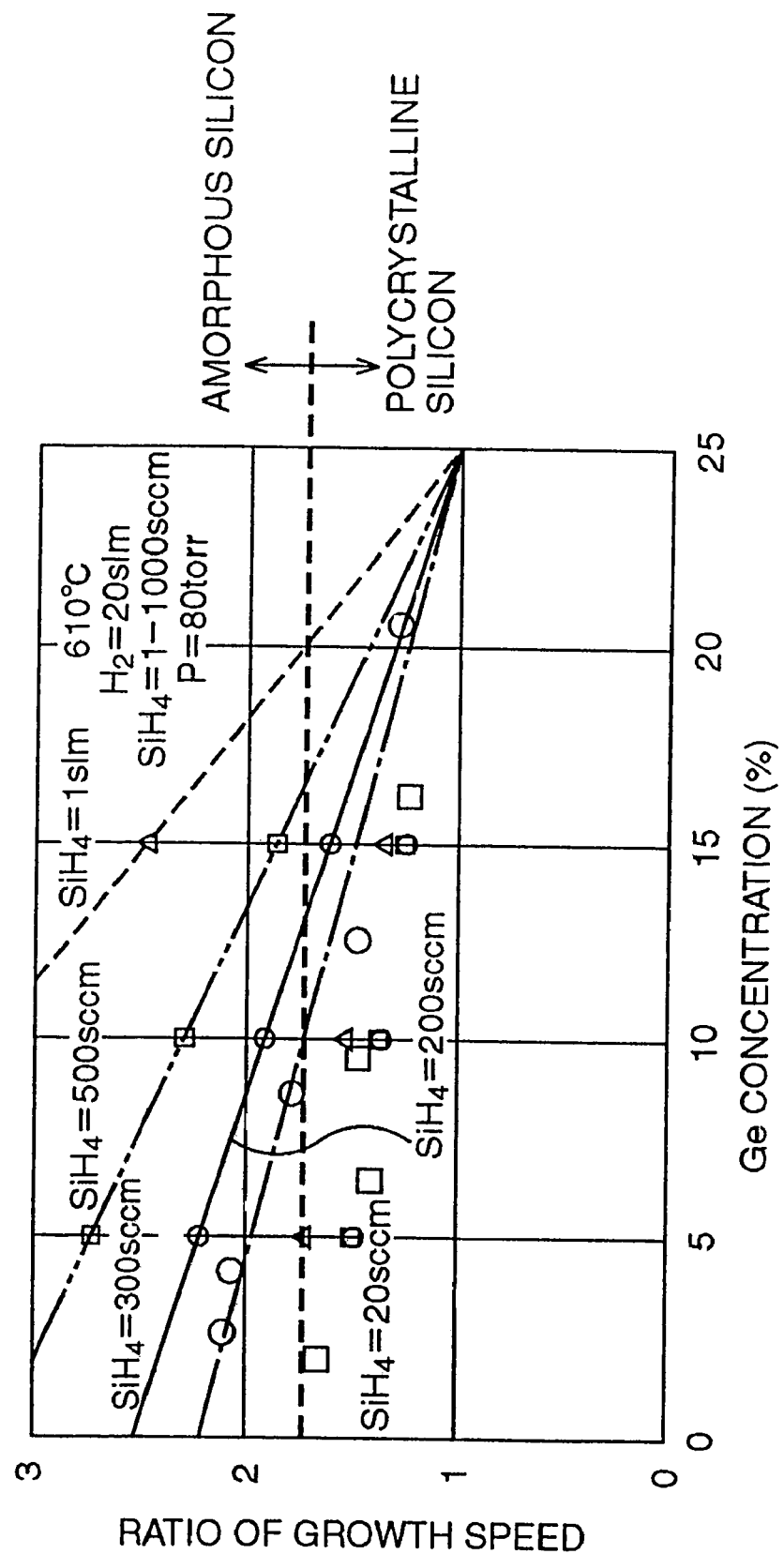
FIG. 4 is a graph showing a relationship between the Ge concentration of the epitaxial film and the ratio of the growth speed thereof when a flow rate of $SiH_4$ is changed.

FIG. 3 is a graph showing a relationship between the Ge concentration of an epitaxial film and the ratio of a growth speed thereof when a growth temperature of the epitaxial film is changed. FIG. 4 is a graph showing a relationship between the Ge concentration of an epitaxial film and the ratio of a growth speed of an epitaxial film when a flow rate of $SiH_4$ is changed. Here, the ratio of a growth speed in FIG. 3 and FIG. 4 designates the ratio of a growth speed of a polycrystalline film or an amorphous film relative to the growth speed of an epitaxial film, and in both diagrams the flow rate of $GeH_4$ is changed so as to change the Ge concentration of an epitaxial film. Also, in FIG. 3 and FIG. 4, polycrystalline films and amorphous films grow above the dashed line, and only polycrystalline films grow below the dashed line.

As can be understood from FIG. 3 and FIG. 4, the growth speed of a polycrystalline film or an amorphous film can be independently changed by changing a growth temperature or an amount of a source gas ($SiH_4$). Especially, it is understood that when an amorphous film grows, the ratio of a growth speed relative to the growth speed of an epitaxial film cab be taken largely. In addition, epitaxial films grow as single crystal within the range shown in FIG. 3 and FIG. 4.

Specifically, as shown in FIG. 3, as the growth temperature falls, desorption of deposition species is restrained, an absorption reaction is facilitated, and the growth speed of a polycrystalline film or an amorphous film on an insulation film increases. Also, as shown in FIG. 4, as the flow rate of source gas ($SiH_4$) increases, desorption of the deposition species is restrained, an absorption reaction is facilitated, and the growth speed of a polycrystalline film or an amorphous film on an insulation film increases. Also, according to FIG. 3 and FIG. 4, by setting the growth speed of polycrystalline to less than or equal to 1.8 times the growth speed of single crystal, a polycrystalline film can be grown without growing an amorphous portion.

The present invention is made according to these dedicated studies and experimental results, and it is directed to a semiconductor device having a bipolar transistor in which a base, an emitter, and a collector are formed on a semiconductor substrate.

Specific Embodiments of the Present Invention

Next, specific embodiments of the present invention will be explained with reference to the attached drawings.

First Embodiment

First, a first embodiment of the present invention will be explained. In the first embodiment, an npn-type bipolar transistor is presented as an example, and for convenience, its structure is explained with a manufacturing method thereof. FIG. 5A to FIG. 5L are cross-sectional views showing the sequential steps of the manufacturing method of a bipolar transistor (semiconductor device) according to the first embodiment of the present invention.

Figure 5A:
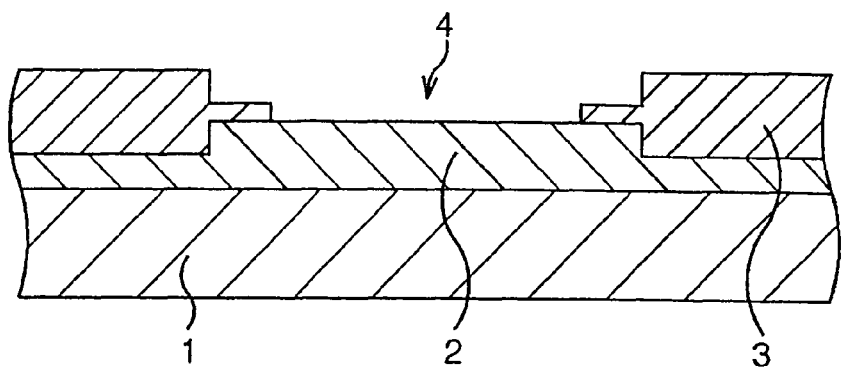
FIG. 5A to FIG. 5L are cross-sectional views showing the sequential steps of a manufacturing method of a bipolar transistor (semiconductor device) according to a first embodiment of the present invention.

In order to manufacture this bipolar transistor, first, as shown in FIG. 5A, n-type impurities, here phosphors, are ion-implanted under conditions of its dose amount of $1 \times 10^{14}/cm^2$ and acceleration energy of 300 keV on the surface of a semiconductor substrate 1 of p-type silicon substrate or the like, that is, a region where a collector is planned to be formed, thereby forming an $n^+$ diffusion region 2. This $n^+$ diffusion region 2 is to be functioning as a collector.

Subsequently, by so-called LOCOS method, a field oxide film 3 is formed on an element isolation region of the semiconductor substrate 1 to define an active region 4.

Figure 5B:
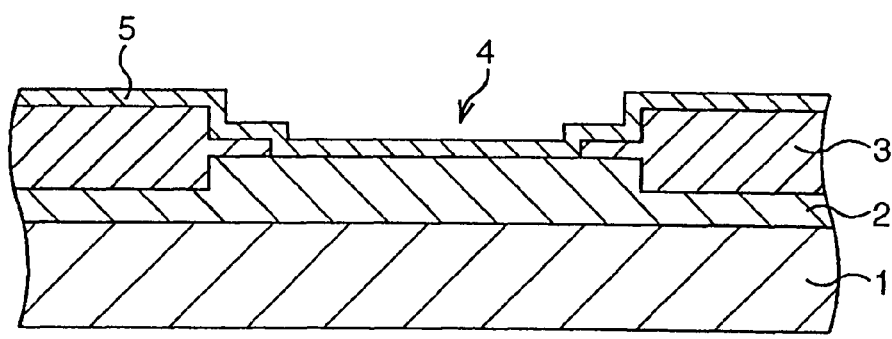

Thereafter, as shown in FIG. 5B, a silicon oxide film 5 is formed on the whole surface by a CVD method. A thickness of the silicon oxide film 5 is 30 nm to 100 nm for example. In addition, the field oxide film 3 and the silicon oxide film 5 may be formed before forming the $n^+$ diffusion region 2.

Figure 5C:
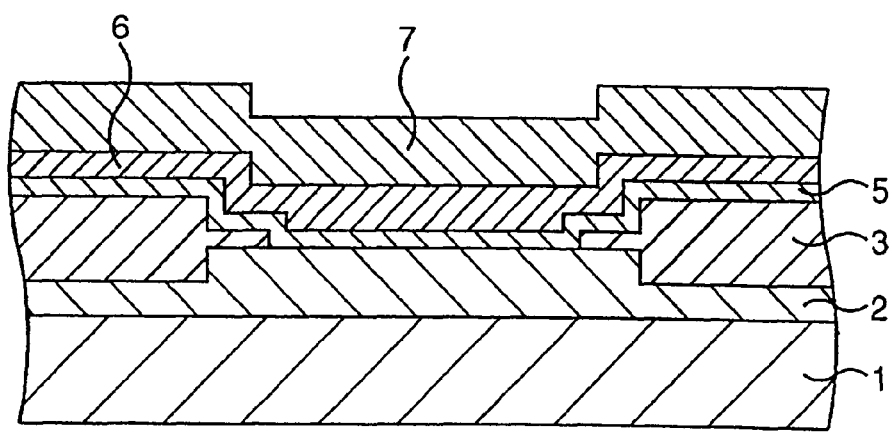

Next, as shown in FIG. 5C, on the silicon oxide film 5, a polycrystalline silicon film 6 is formed by a CVD method for example, and thereafter a silicon oxide film 7 is further formed thereon by a CVD method for example. A thickness of the silicon oxide film 7 is 300 nm to 700 nm for example.

Figure 5D:
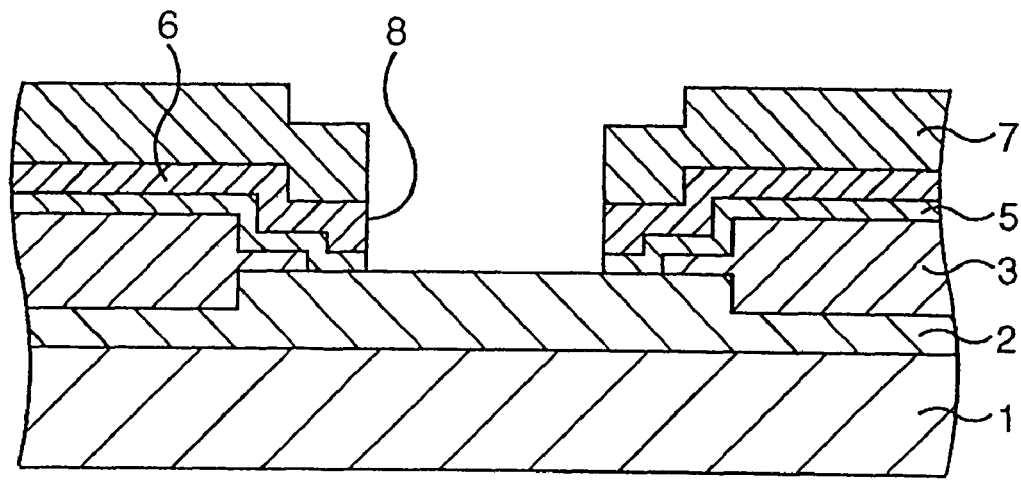

Subsequently, as shown in FIG. 5D, by a photolithography and a subsequent dry etching, a region is processed where a base is to be formed in a multilayer film of the silicon oxide film 5, the polycrystalline silicon film 6, and the silicon oxide film 7, thereby on this region a base opening 8 is formed with a certain pattern that exposes a part of the surface of the $n^+$ diffusion region 2. The polycrystalline silicon film 6 will be a lead-out layer of a base layer that will be formed in a later step.

Figure 5E:
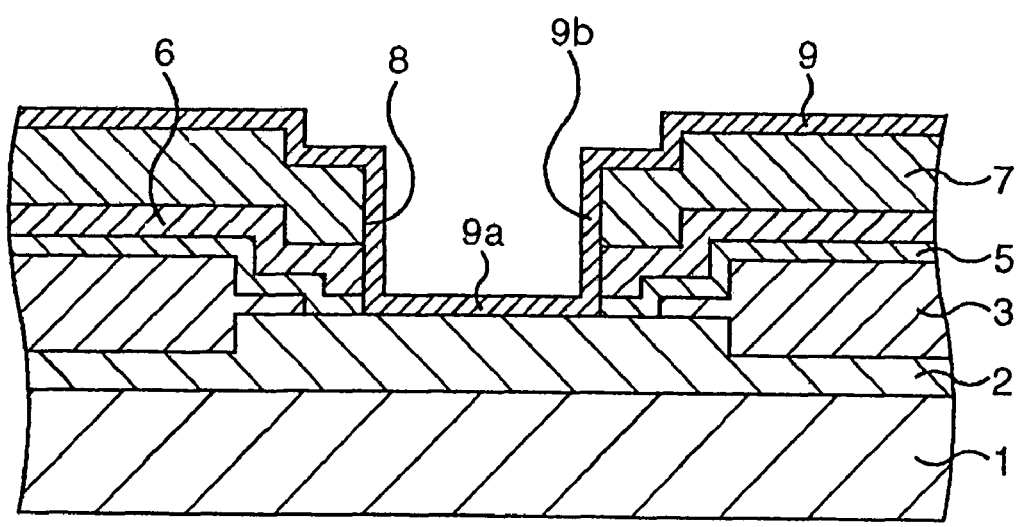

Thereafter, as shown in FIG. 5E, by a low pressure non-selective epitaxial growth method, a semiconductor film, an SiGe film 9 in this example, is grown and formed on the whole surface of the silicon oxide film 7 so as to cover an inner wall of the base opening 8. A thickness of the SiGe film 9 is approximately 80 nm for example.

Here, such film forming conditions are selected according to FIG. 3 and FIG. 4 that, inside the base opening 8, a bottom portion 9a that covers an exposed surface of the $n^+$ diffusion region 2 is formed of single crystal, other portions such as a sidewall portion 9b are formed of polycrystalline, and a film thickness of the sidewall portion 9b is less than or equal to 1.5 times the film thickness of the bottom portion 9a. In other words, conditions below the dashed line in FIG. 3 and FIG. 4 are selected. Here, the film thickness of the sidewall portion 9b is not a thickness in a vertical direction relative to the semiconductor substrate 1, but a vertical direction relative to a side surface of the base opening 8.

One example of such condition of film forming by non-selective epitaxial growth will be explained below. In case of a low pressure CVD method for example, monosilane ($SiH_4$), hydrogen ($H_2$), diborane ($B_2H_6$), and germane ($GeH_4$) are used as source gases. Then, flow rates of $SiH_4$ and $H_2$ are set to 20 sccm and 20 slm respectively for example. Also, when a Ge concentration in the SiGe film 9 is set to an atomic percentage of 15%, for example, a pressure of the film forming atmosphere is set to $1.067 \times 10^4$ Pa (80 Torr), a growth temperature is set to 650° C., and a growth speed of the single crystal bottom portion 9a is set to 10 nm/minute. A flow rate of the diborane is set to 75 sccm so that a boron concentration in the SiGe film 9 will be approximately $7\times10^{19}$ atoms/cm$^3$ for example, and the flow rate of the germane is set to 35 sccm for example.

In addition, while the growth speed of the bottom portion 9a is set to 10 nm/minute in the above example, it is preferred to select an appropriate growth speed according to the Ge content (Ge concentration) in the SiGe film 9.

Further, the SiGe composed crystal film 9 is formed in the above example, but a single layer film of an SiGeC composed crystal film or a layered film of an SiGeC composed crystal film and an SiGe composed crystal film can be formed instead. When forming the SiGeC film, monomethylsilane (SiH$_3$CH$_3$) can be further used as a source gas. In addition, when forming the layered film, it is preferred to form the SiGeC film on the SiGe film. Further, other than the SiGe film 9, a GaAs film, an InP film or the like may be formed with a predetermined base film.

Figure 5F:
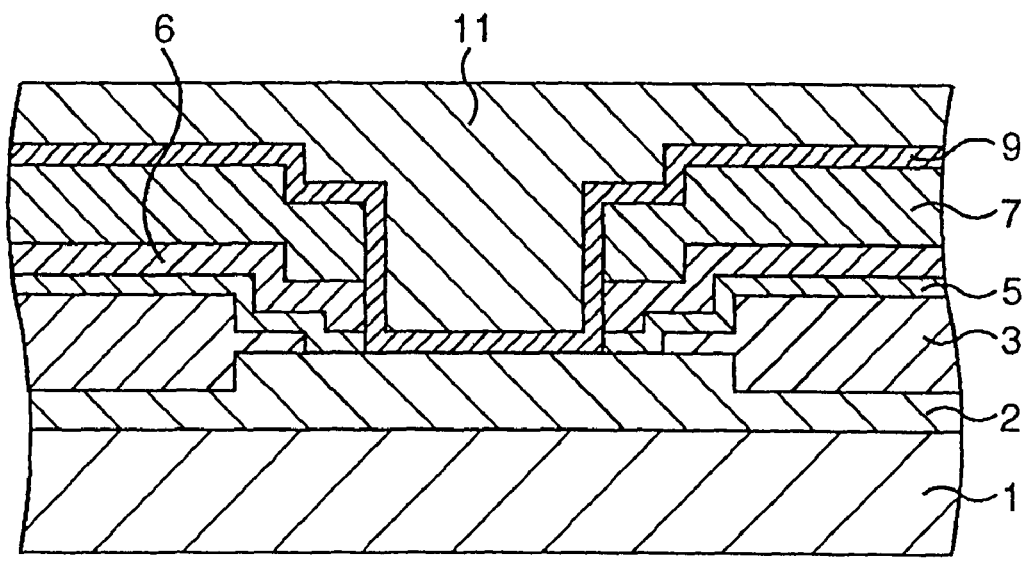

After the SiGe film 9 is formed, a photoresist 11 to be a mask material is applied on the whole surface by a film thickness that fills up the base opening 8 as shown in FIG. 5F.

Figure 5G:
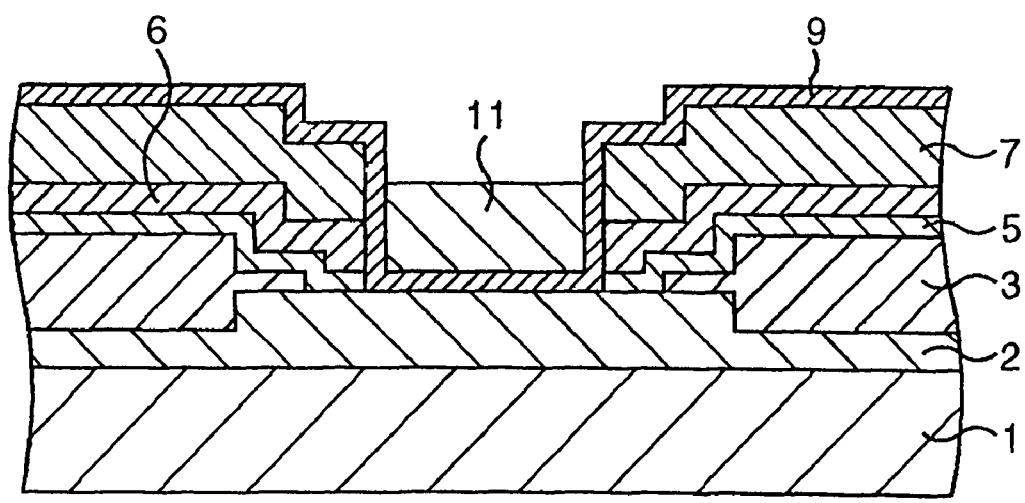

Next, as shown in FIG. 5G, the photoresist 11 is left only in the base opening 8 with a predetermined depth by performing an anisotropic etching on the whole surface of the photoresist 11.

Figure 5H:
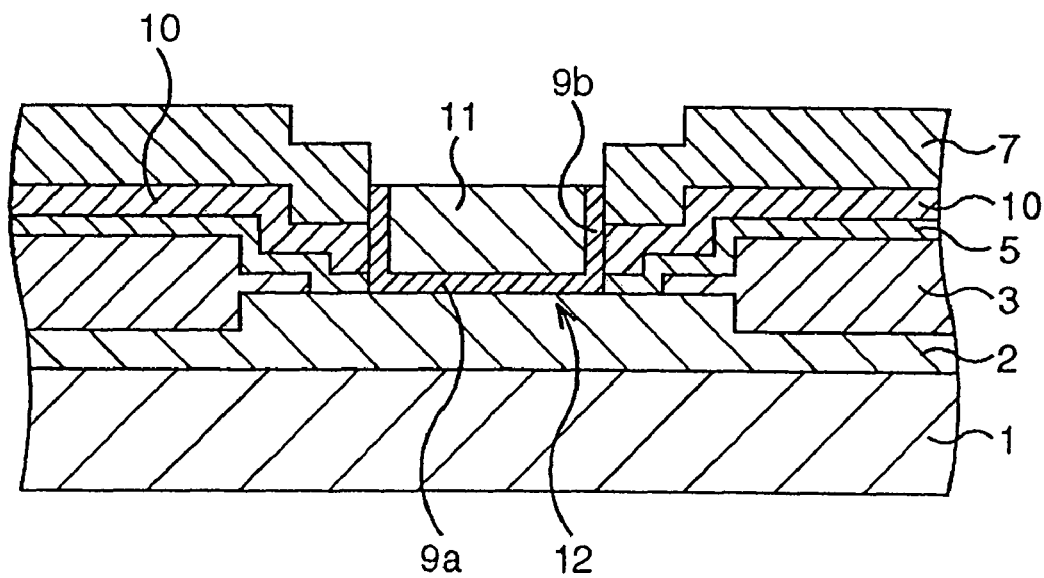

Then, as shown in FIG. 5H, by performing an anisotropic dry etching on the SiGe film 9 using the photoresist 11 as a mask, the SiGe film 9 is left only in the base opening 8 with approximately the same depth as the photoresist 11, and the other portions of the SiGe film 9 are removed. In other words, only the bottom portion 9a and the sidewall portion 9b of the SiGe film 9 are left. As a result, a base 12 is formed integrally from the flat bottom portion 9a formed of single crystal and the sidewall portion 9b formed of polycrystal that is vertical relative to the bottom portion 9a. This base 12 will be electrically connected by the sidewall portion 9b to a base lead-out layer 10 that is formed from the polycrystalline silicon film 6 by patterning.

Figure 5I:
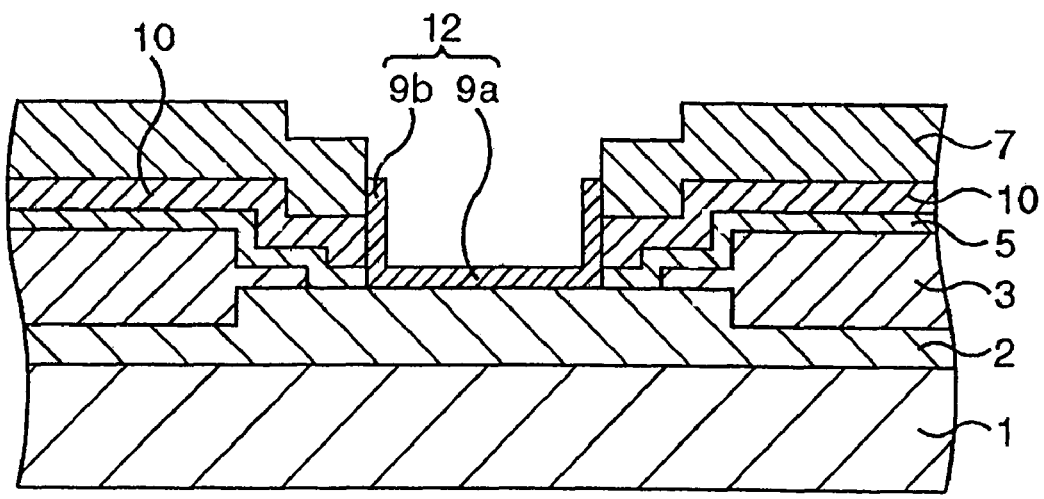

Then, the photoresist 11 is removed by ashing treatment or the like as shown in FIG. 5I.

Figure 5J:
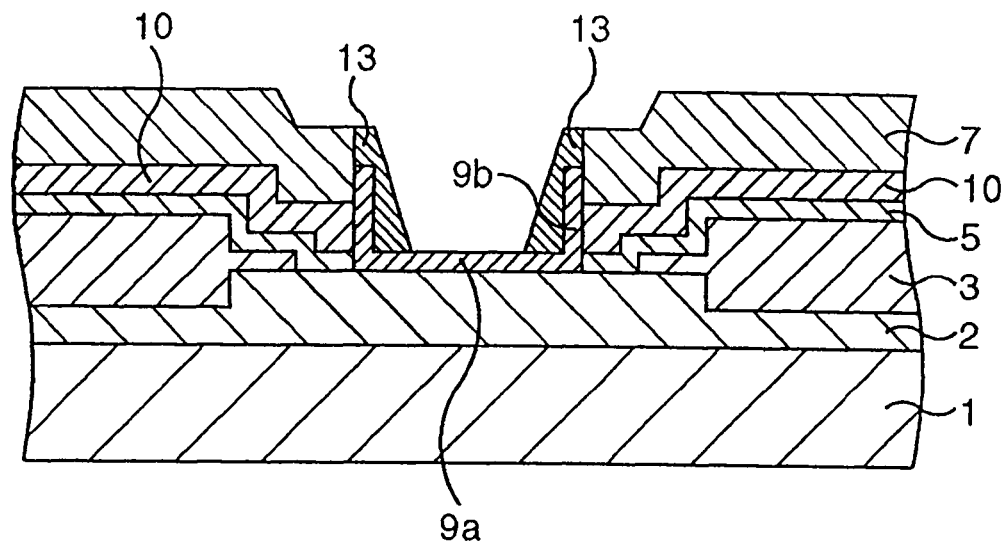

Subsequently, as shown in FIG. 5J, a silicon oxide film is deposited on the whole surface by a CVD method, and by performing an anisotropic etching (etch back) on the whole surface, a surface of the center portion of the bottom portion 9a of the base 12 is exposed, thereby forming a sidewall 13 that covers a peripheral portion of the bottom portion 9a, the sidewall portion 9b, and a side surface of the silicon oxide film 7. The sidewall 13 has a shape to open the base opening 8 of the base 12 in tapered shape for example.

Figure 5K:
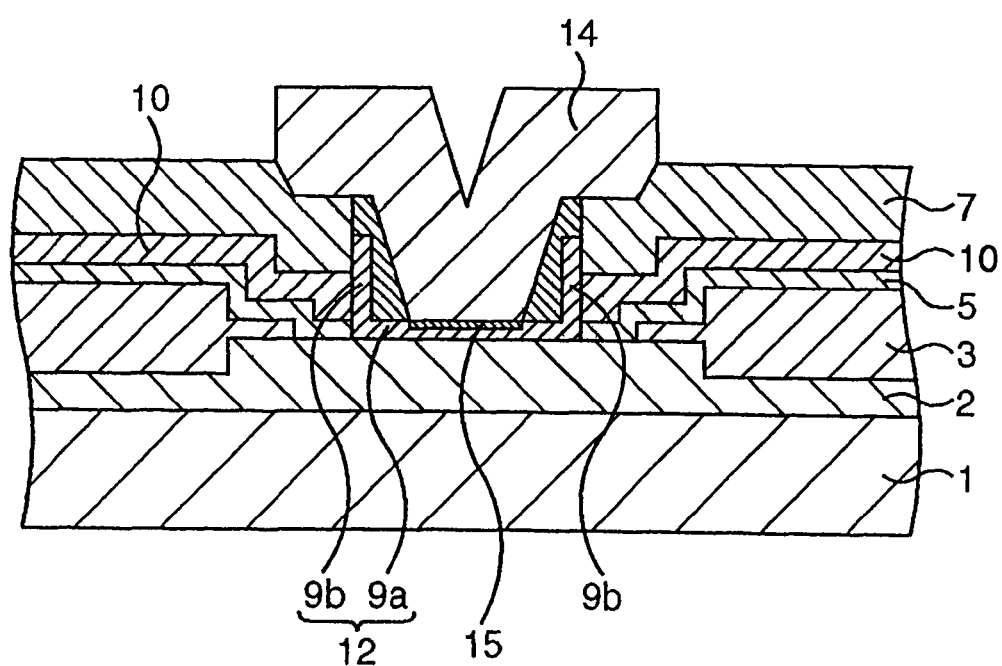

Thereafter, as shown in FIG. 5K, an n-type polycrystalline silicon film or an amorphous silicon film is deposited on the whole surface by a CVD method, and this film is processed by a photolithography and a subsequent dry etching to form an emitter 14 which is connected on its bottom portion to the bottom portion 9a of the base 12. By an effect of heat generated when depositing the n-type polycrystalline silicon film or the amorphous silicon film and by a subsequent heat treatment, n-type impurities contained therein are partly diffused into a surface layer of the bottom portion 9a of the base 12 to form a shallow junction 15. Thus, a connection is securely made between the base 12 and the emitter 14.

Figure 5L:
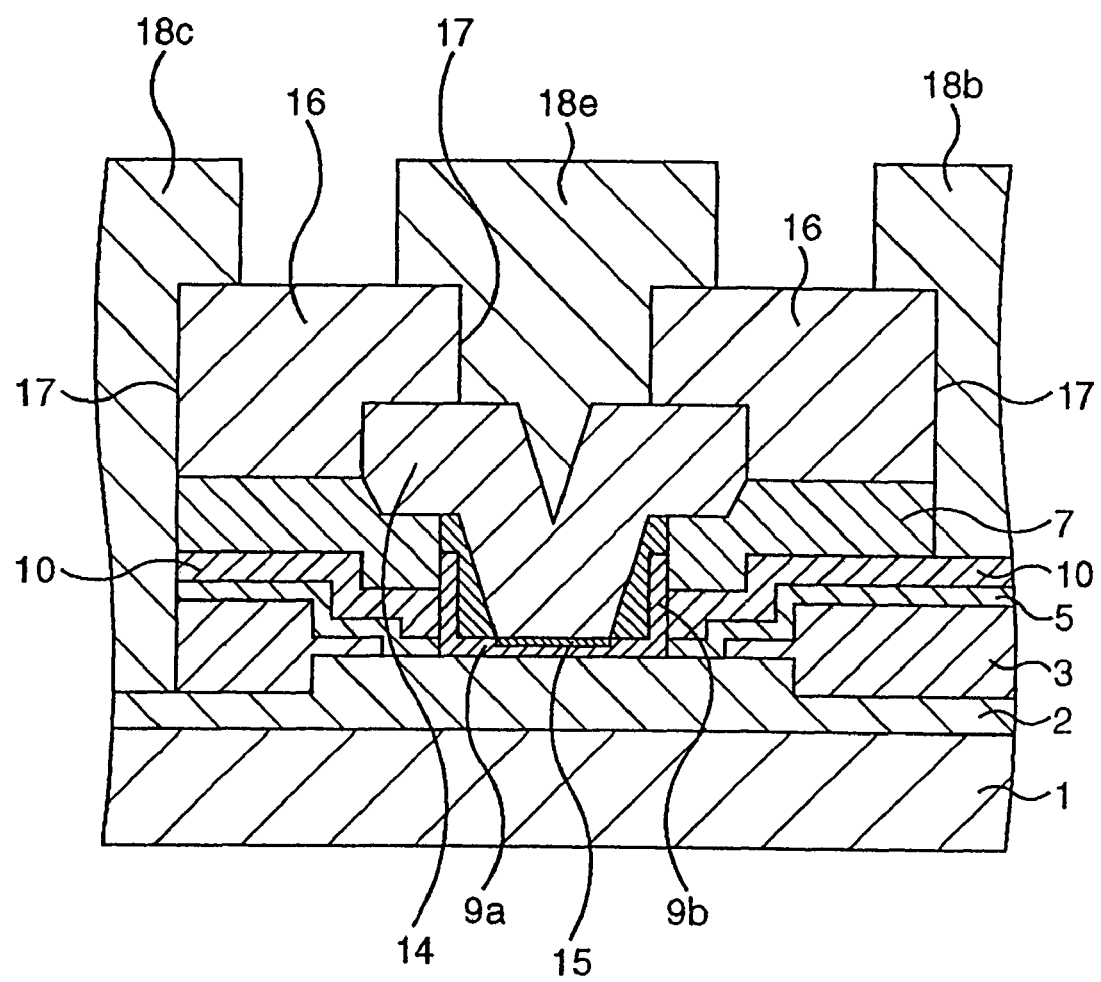

Thereafter, as shown in FIG. 5L, there are formed an interlayer insulation film 16, a contact hall 17, a collector electrode 18c, an emitter electrode 18e, a base electrode 18b, a wire layer (not shown) and so on, to thereby complete a bipolar transistor of this embodiment.

As has been described above, according to this embodiment, the film thickness of the sidewall portion 9b is made to be approximately 1.5 times the film thickness of the bottom portion 9a by controlling the film forming conditions when forming the SiGe film 9, so that even if dispersion occurs in a width of the base opening 8 or in a film thickness of the sidewall 13, it is possible to securely achieve an electrical connection between the base and the emitter. As a result, transistor characteristics such as drive speed, high frequency characteristic and the like are improved, and the emitter can be further miniaturized, so that a bipolar transistor with high reliability can be realized.

In addition, when the film thickness of the sidewall portion 9b is less than one times the film thickness of the bottom portion 9a, the resistance of the sidewall portion 9b increases, so the transistor characteristics decrease. On the other hand, when the film thickness of the sidewall portion 9b is more than two times the film thickness of the bottom portion 9a, the width of the base opening 8 becomes narrow, which can cause a disconnection between the base and the emitter. Therefore, in the first embodiment, the film thickness of the sidewall portion 9b is required to be one to two times, 1.5 times for example, the film thickness of the bottom portion 9a.

Second Embodiment

Next, a second embodiment of the present invention will be explained. In the second embodiment, an npn-type bipolar transistor is presented as an example, and for convenience, its structure is explained with a manufacturing method thereof. FIG. 6A to FIG. 6E are cross-sectional views showing the sequential steps of the manufacturing method of a bipolar transistor (semiconductor device) according to the second embodiment of the present invention.

Figure 6A:
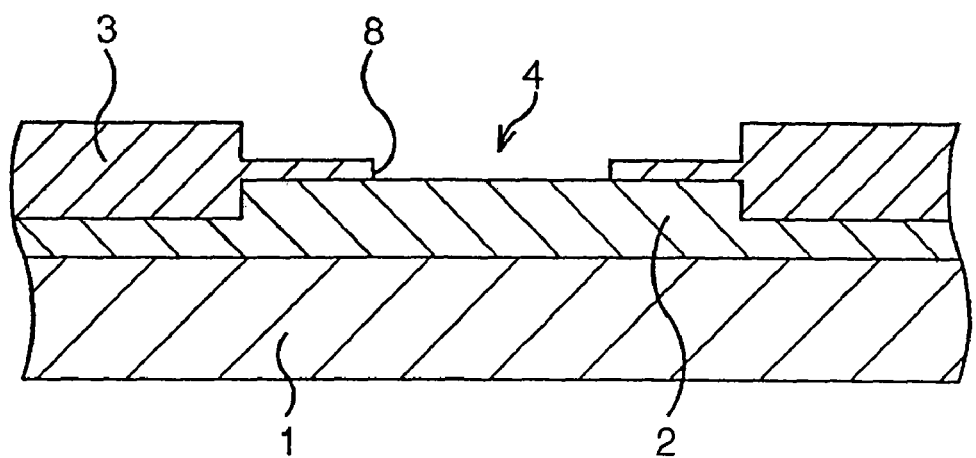
FIG. 6A to FIG. 6E are cross-sectional views showing the sequential steps of a manufacturing method of a bipolar transistor (semiconductor device) according to a second embodiment of the present invention.

In order to manufacture this bipolar transistor, first, as shown in FIG. 6A, n-type impurities, here phosphors, are ion-implanted under conditions of its dose amount of $1\times10^{14}$/cm$^2$ and acceleration energy of 300 keV on the surface of a semiconductor substrate 1 of p-type silicon substrate or the like, that is, a region where a collector is planned to be formed, thereby forming an n$^+$ diffusion region 2. This n$^+$ diffusion region 2 is to be functioning as a collector. In addition, the region to which an ion-implantation is performed is a region to which an element active region is planned to be formed for example.

Subsequently, by so-called LOCOS method, a field oxide film 3 is formed on an element isolation region of the semiconductor substrate 1 to define an active region 4. In this embodiment, an opening of the field oxide film 3 will be a base opening 8.

Figure 6B:
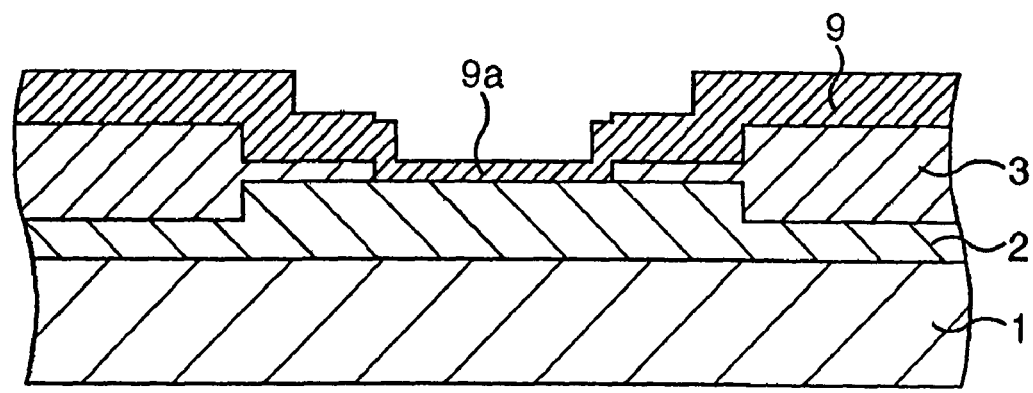

Thereafter, as shown in FIG. 6B, by a low pressure non-selective epitaxial growth method, a semiconductor film, an SiGe film 9 in this example, is grown and formed on the base opening 8 and on the whole surface of the field oxide film 3.

Here, such film forming conditions are selected according to FIG. 3 and FIG. 4 that, inside the base opening 8, a bottom portion 9a that covers an exposed surface of the n$^+$ diffusion region 2 is formed of single crystal, other portions are formed of polycrystalline and amorphous, and a film thickness of a portion on the field oxide film 3 is more than or equal to two times the film thickness of a bottom portion 9a. In other words, the conditions are selected so as to include conditions above the dashed line in FIG. 3 and FIG. 4. In this embodiment, the bottom portion 9a functions as a base and the other portion of the SiGe film 9 functions as a base lead-out layer.

In addition, an amorphous portion of the SiGe film 9 becomes polycrystalline by a heat treatment thereafter, so that even when a polycrystalline portion and an amorphous portion exist on the portion except the bottom portion 9a of the SiGe film 9 just after the SiGe film 9 is formed, the film will be composed of a single layer of a polycrystalline film at last.

One example of such condition of film forming by non-selective epitaxial growth will be explained below. In case of a low pressure CVD method for example, monosilane (SiH$_4$), hydrogen (H$_2$), diborane (B$_2$H$_6$), and germane (GeH$_4$) are used as source gases. Then, flow rates of SiH$_4$ and H$_2$ are set to 200 sccm and 20 slm respectively for example. Also, when a Ge concentration in the SiGe film 9 is set to an atomic percentage of 15%, for example, a pressure of the film forming atmosphere is set to $1.067\times10^4$ Pa (80 Torr), a growth temperature is set to 600° C., and a growth speed of the single crystal bottom portion 9a is set to 10 nm/minute. Then, a flow rate of the diborane is set to 200 sccm so that a boron concentration in the SiGe film 9 will be approximately $7\times10^{19}$ atoms/cm$^3$ for example, and the flow rate of the germane is set to 160 sccm for example.

In addition, while the growth speed of the bottom portion 9a is set to 10 nm/minute in the above example, it is preferred to select an appropriate growth speed according to the Ge content (Ge concentration) in the SiGe film 9.

Further, the SiGe composed crystal film 9 is formed in the above example, but a single layer film of an SiGeC composed crystal film or a layered film of an SiGeC composed crystal film and an SiGe composed crystal film can be formed instead, similarly to the first embodiment. When forming the SiGeC film, monomethylsilane (SiH$_3$CH$_3$) can be further used as a source gas. In addition, when forming the layered film, it is preferred to form the SiGeC film on the SiGe film. Further, other than the SiGe film 9, a GaAs film, an InP film or the like may be formed with a predetermined base film.

Figure 6C:
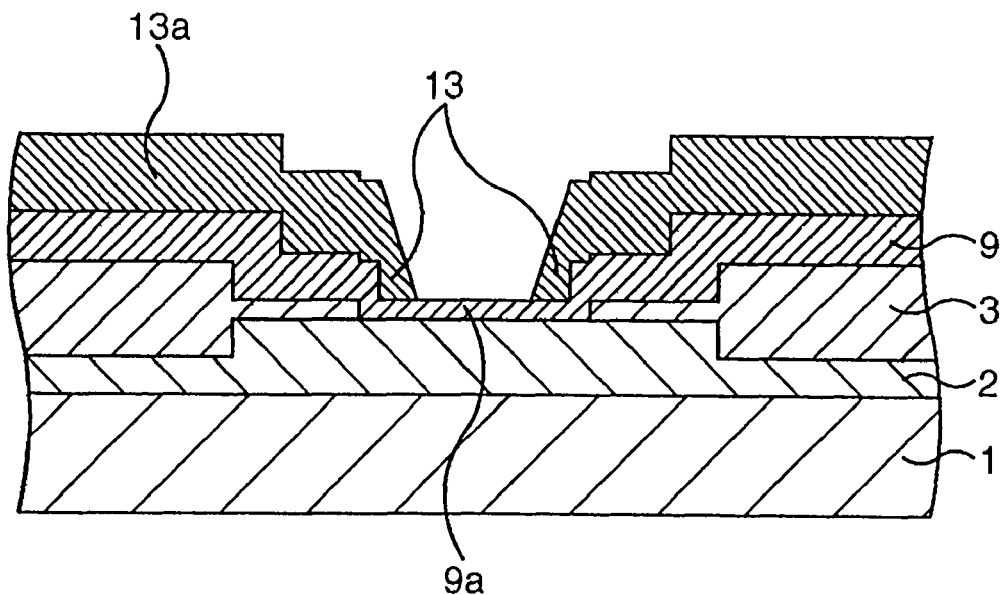

After the SiGe film 9 is formed, as shown in FIG. 6C, a silicon oxide film 13a is deposited on the whole surface by a CVD method, a patterning by a photolithography is performed thereon, and thereafter an anisotropic etching (etch back) is performed on the opening to expose a surface of the center portion of the bottom portion 9a, thereby forming a sidewall 13 that covers the other portions of the SiGe film 9. The sidewall 13 has a shape to open the base opening 8 of the bottom portion 9a in tapered shape for example.

Figure 6D:
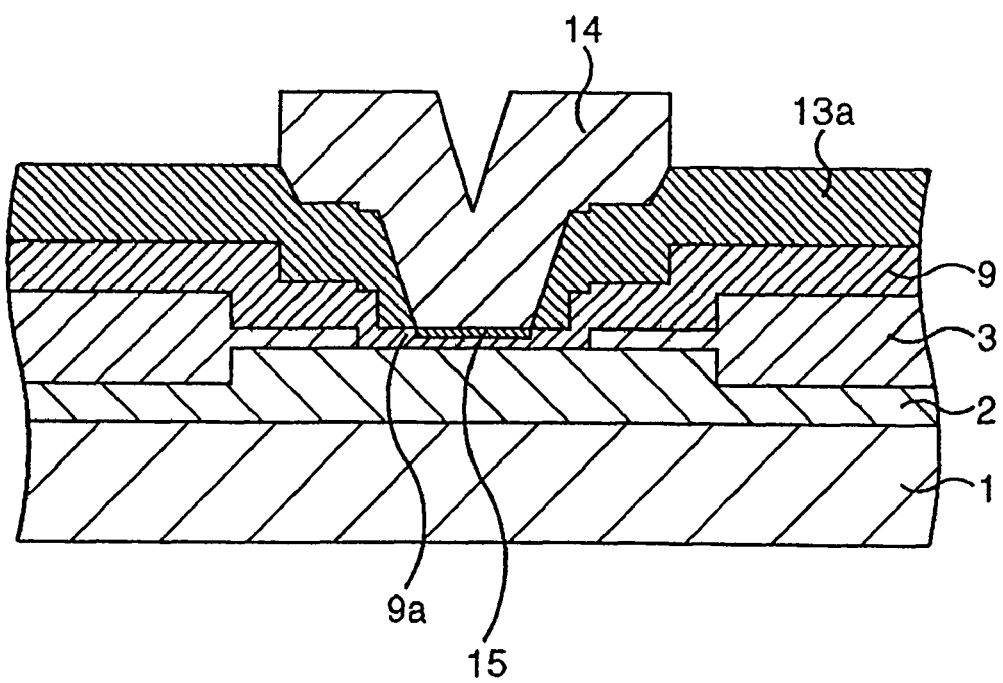

Subsequently, as shown in FIG. 6D, an n-type polycrystalline silicon film or an amorphous silicon film is deposited on the whole surface by a CVD method, and this film is processed by a photolithography and a subsequent dry etching to form an emitter 14 which is connected on its bottom portion to the bottom portion 9a. By an effect of heat generated when depositing the n-type polycrystalline silicon film or the amorphous silicon film and by a subsequent heat treatment, n-type impurities contained therein are partly diffused into a surface layer of the bottom portion 9a to form a shallow junction 15. Thus, a connection is securely made between the bottom portion 9a that functions as a base and the emitter 14.

Figure 6E:
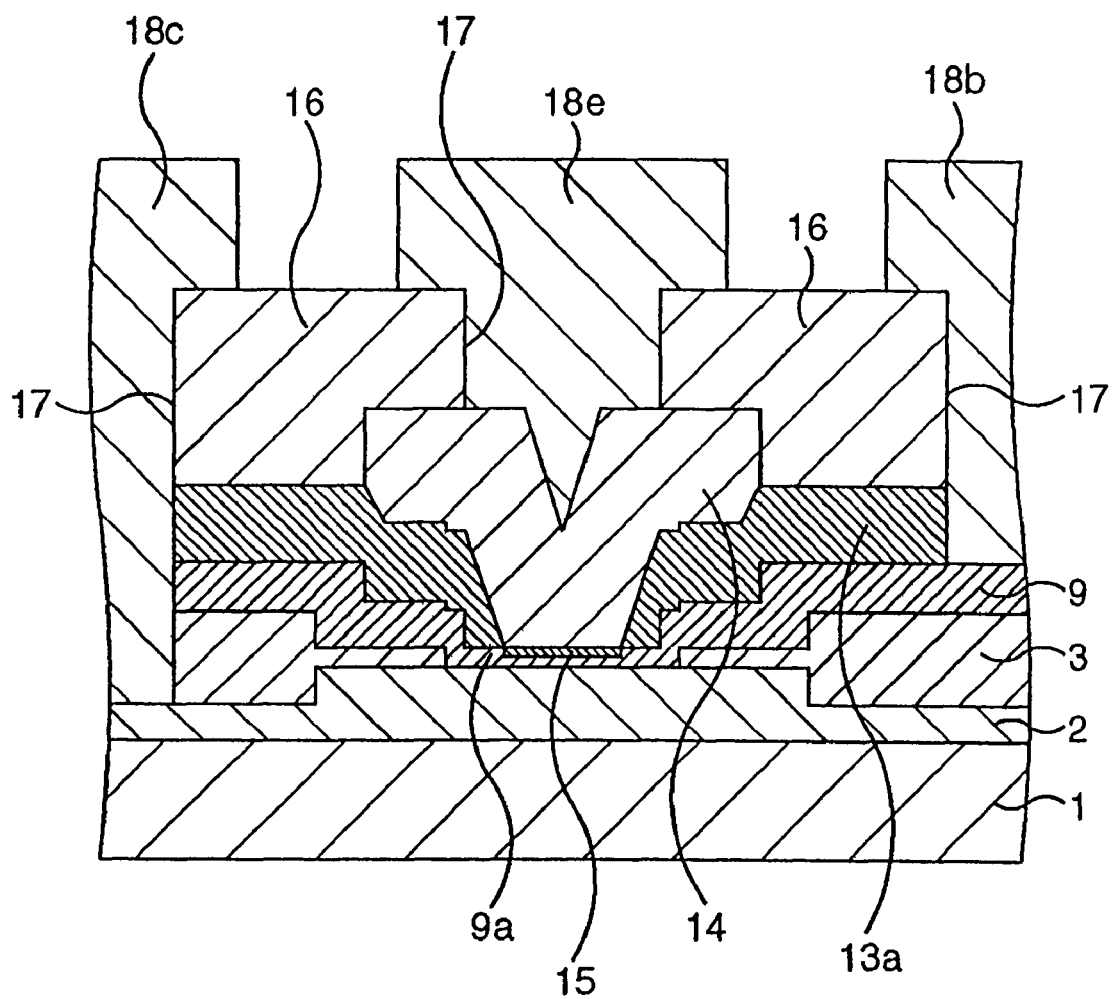

Thereafter, as shown in FIG. 6E, there are formed an interlayer insulation film 16, a contact hall 17, a collector electrode 18c, an emitter electrode 18e, a base electrode 18b, a wire layer (not shown), and so on, to thereby complete a bipolar transistor of this embodiment.

In the prior manufacturing method of SiGe-HBT, as described above, a polycrystalline film is insufficient in its film thickness for functioning as a base lead-out layer only with the films formed by non-selective epitaxial growth, so that it is performed in such a manner that a polycrystalline film is grown, a region is opened on which a single crystal film that functions as a base will be formed, and thereafter, by non-selective epitaxial growth, a single crystal base layer is formed while a polycrystalline film that functions as a base lead-out layer being formed.

On the other hand, according to this embodiment, as shown in FIG. 6B, the bottom portion 9a that functions as a base and is formed of single crystal, and a polycrystalline film that functions as a base lead-out layer are formed by performing one non-selective epitaxial growth. Accordingly, a bipolar transistor having a high reliability equal to that of the conventional one can be realized while reducing at least growth of a polycrystalline film and three steps of photolithography (a formation of a photoresist, a patterning, and a removal of the photoresist).

In addition, although npn-type bipolar transistors are presented as examples in the first and second embodiments, the present invention is not limited thereto, and it is possible to realize a pnp-type bipolar transistor by forming all the n-type and p-type component portions described above to be a reverse conducting type. Furthermore, by using the manufacturing method of the present invention, it is possible to realize a low power consumption Bi-CMOS transistor and a bipolar IC having a high-speed transistor with its base film thin in thickness.

Also, in the first embodiment, an aluminum film can be formed instead of the polycrystalline silicon film 6. Further, in both of the first and second embodiments, a silicon nitride film can be formed instead of the silicon oxide films 7 or 13a.

Figure 7:
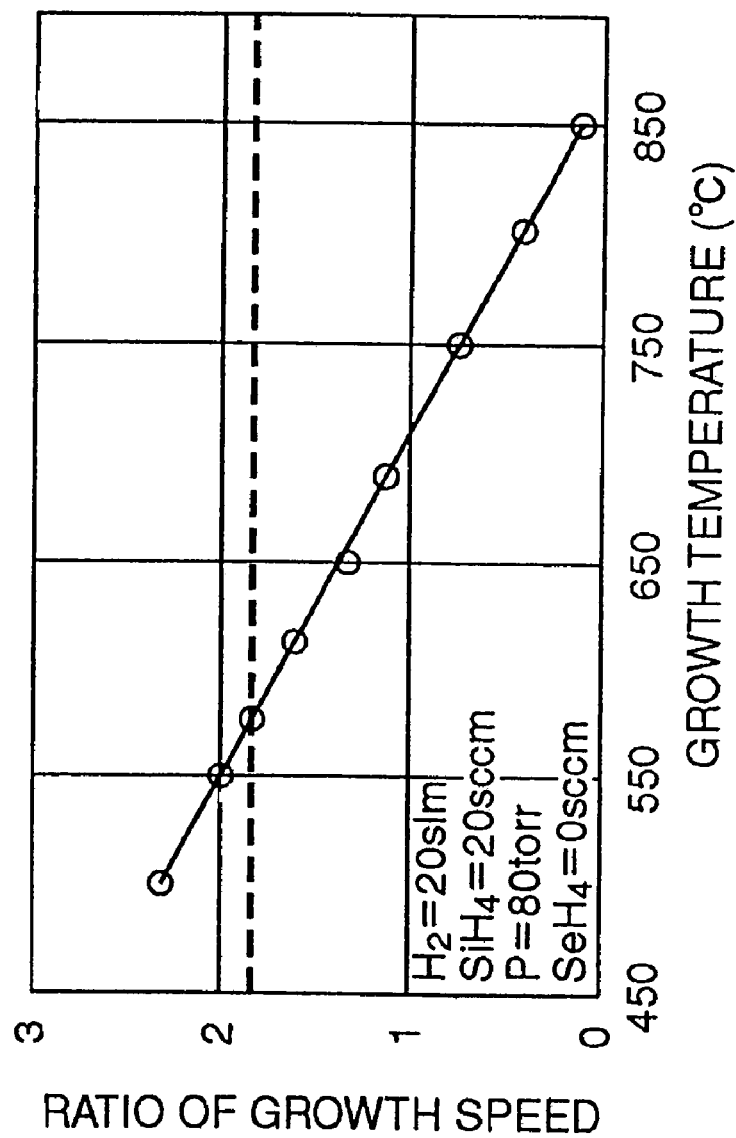
FIG. 7 is a graph showing a relationship between the growth temperature of the Si film and the ratio of a growth speed thereof.
Figure 8:
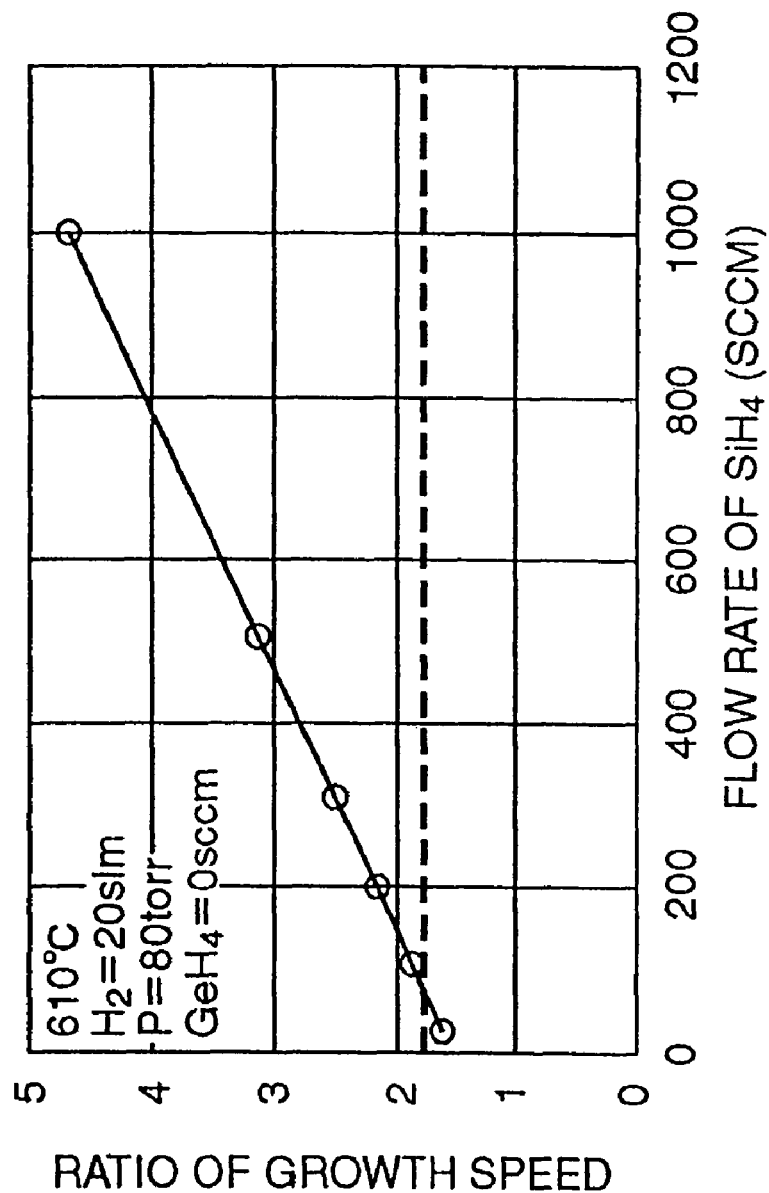
FIG. 8 is a graph showing a relationship between the flow rate of $SiH_4$ in the Si film and the ratio of a growth speed thereof.

In addition, although the SiGe film, the SiGeC film, and the layered film of these films are presented as examples of the semiconductor film to be the base in the first and second embodiments, the type of the semiconductor film is not limited thereto, and an Si film can be used instead for example. FIG. 7 is a graph showing a relationship between the growth temperature of the Si film and the ratio of a growth speed thereof, which is showing the relationship between the growth temperature and the ratio of the growth speed when the Ge concentration is 0 (zero) percent in the graph shown in FIG. 3. Also, FIG. 8 is showing a relationship between the flow rate of SiH$_4$ in the Si film and the ratio of a growth speed thereof, which is showing the relationship between the flow rate of SiH$_4$ and the ratio of the growth speed when the Ge concentration is 0 (zero) percent in the graph shown in FIG. 4. As shown in FIG. 7 and FIG. 8, when forming the Si film, it is possible to adjust the ratio of the growth speed by changing the growth temperature and/or the flow rate of SiH$_4$.

When the Si film is formed as the semiconductor film to be the base, an electrical characteristic improves as described below. The inventor of the present invention formed the Si film as the semiconductor film, made a bipolar transistor having the ratio of a thickness between a bottom portion and a sidewall portion of the Si film as 1:1 (comparative example) and a bipolar transistor having the ratio of a thickness between a bottom portion and a sidewall portion as 1:1.5 (example), and measured base resistance and the maximum frequency ($f_{max}$) of each sample. As a result, the base resistance was 32Ω and the maximum frequency was 104.2 GHz in the comparative example, whereas the base resistance was 26Ω and the maximum frequency was 114.2 GHz in the example. In other words, in the example, the base resistance became approximately 20 percent lower than that of the comparison example, and further, the maximum frequency became approximately 10 percent higher.

As has been described in detail above, in a semiconductor film in the present invention, a portion in contact with a collector is formed of single crystal, a portion in contact with a conductive film is formed of polycrystal, and a film thickness of the portion in contact with a conductive film is one to two times the film thickness of the portion in contact with a collector, to thereby secure the connection between a base and an emitter even when the type of a substrate is different and a shape or area of the base is changed. Therefore, transistor characteristics are stabilized, and dispersion of characteristics can be reduced.

Also, regarding a semiconductor film similarly, a portion in contact with a collector is formed of single crystal, and a thickness of a portion on an insulation film is composed of a single layer film that is thicker than the portion in contact with a collector, so that the manufacturing steps can be reduced while lowering the resistance of a base lead-out layer.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a semiconductor substrate having a collector formed thereon;
   an insulation film formed on said semiconductor substrate, said insulation film having an opening formed on a portion that corresponds to the collector;
   a semiconductor film formed inside the opening and over said insulation film, said semiconductor film being composed of a single layer, a portion in contact with the collector of said semiconductor film being formed of single crystal, and a portion of said semiconductor film over said insulation film being thicker than the portion in contact with the collector; and
   an emitter formed on the portion in contact with the collector of said semiconductor film.

2. The semiconductor device according to claim 1, wherein said semiconductor film contains an amorphous portion.

3. The semiconductor device according to claim 1, wherein said semiconductor film is a film comprising at least a film selected from a group including an SiGe composed crystal film and an SiGeC composed crystal film.

4. The semiconductor device according to claim 1, wherein said insulation film is a silicon oxide film.

5. The semiconductor device according to claim 1, further comprising a second insulation film that insulates between the portion on said insulation film of said semiconductor film and the emitter.

6. The semiconductor device according to claim 5, wherein said second insulation film is a film selected from a group including a silicon oxide film and a silicon nitride film.

* * * * *